United States Patent [19]
Fiebag et al.

[11] Patent Number: 6,143,479
[45] Date of Patent: Nov. 7, 2000

[54] DEVELOPING SYSTEM FOR ALKALINE-DEVELOPABLE LITHOGRAPHIC PRINTING PLATES

[75] Inventors: Ulrich Fiebag, Nienstadt; Hans-Joachim Timpe, Osterode, both of Germany

[73] Assignee: Kodak Polychrome Graphics LLC, Norwalk, Conn.

[21] Appl. No.: 09/449,072

[22] Filed: Nov. 24, 1999

Related U.S. Application Data

[60] Provisional application No. 60/151,697, Aug. 31, 1999.

[51] Int. Cl.$^7$ ........................................................ G03F 7/32
[52] U.S. Cl. ............................................ 430/331; 510/176
[58] Field of Search .............................. 430/331; 510/176

[56] References Cited

U.S. PATENT DOCUMENTS

| | | | |
|---|---|---|---|
| 4,259,434 | 3/1981 | Yamasue et al. | 430/302 |
| 4,458,005 | 7/1984 | Mohr et al. | 430/271 |
| 4,469,776 | 9/1984 | Matsumoto et al. | 430/331 |
| 4,927,741 | 5/1990 | Garth et al. | 430/309 |
| 5,122,243 | 6/1992 | Hall | 204/129.35 |
| 5,340,699 | 8/1994 | Haley et al. | 430/302 |
| 5,368,974 | 11/1994 | Walls et al. | 430/156 |
| 5,372,907 | 12/1994 | Haley et al. | 430/157 |
| 5,466,557 | 11/1995 | Haley et al. | 430/278 |
| 5,491,046 | 2/1996 | DeBoer et al. | 430/302 |
| 5,766,826 | 6/1998 | Miller et al. | 430/331 |
| 5,811,221 | 9/1998 | Miller et al. | 430/302 |
| 5,851,735 | 12/1998 | Miller et al. | 430/322 |
| 5,897,985 | 4/1999 | Miller et al. | 430/325 |
| 5,914,217 | 6/1999 | Miller et al. | 430/302 |
| 5,958,655 | 9/1999 | Miller et al. | 430/331 |

FOREIGN PATENT DOCUMENTS

| | | |
|---|---|---|
| 2082339 | 3/1982 | United Kingdom . |
| 2276729 | 10/1994 | United Kingdom . |

*Primary Examiner*—Hoa Van Le
*Attorney, Agent, or Firm*—Ratner & Prestia

[57] ABSTRACT

An aqueous alkaline composition comprising at least one phosphonic acid, at least one polyglycol derivative and at least one glycol. The composition can be used as either a developer or a replenisher for either positive-working or negative-working alkaline developable lithographic printing plates, including thermal plates.

34 Claims, No Drawings

DEVELOPING SYSTEM FOR ALKALINE-DEVELOPABLE LITHOGRAPHIC PRINTING PLATES

CROSS-REFERENCE TO RELATED APPLICATIONS

This application claims priority on U.S. Provisional Appln. No. 60/151,697, filed Aug. 31, 1999.

FIELD OF THE INVENTION

This invention relates to developing systems useful for developing either positive-working or negative-working alkaline-developable lithographic printing plates including thermal plates. It also relates to a method for developing imagewise exposed printing plates.

BACKGROUND OF THE INVENTION

The art of lithographic printing is based upon the immiscibility of oil and water, in which oily material or ink is preferentially retained by the image areas and the water or fountain solution is preferentially retained by the non-image areas of the printing plate. When a suitably prepared surface is moistened with water and ink is applied, the background or non-image areas retain the water and repel the ink while the image areas accept the ink and repel the water. The ink on the image areas is then transferred to the surface of a material upon which the image is to be reproduced, such as paper, cloth and plastics. Commonly, the ink is transferred to an intermediate material called the blanket, which in turn transfers the ink to the surface of the material upon which the image is to be reproduced.

Lithographic printing plates can be either negative-working or positive-working, and comprise one or more radiation-sensitive layers on a suitable substrate, such as metal or polymeric support. The radiation-sensitive layer generally includes one or more radiation-sensitive components that may be dispersed in a suitable binder. Alternatively, the radiation-sensitive component can also be the binder material. Certain useful printing plates can be used either as positive-working or negative-working.

A negative-working printing plate generally has a light sensitive layer composed of a radiation-sensitive component such as an unsaturated resin on a suitable substrate. Upon exposure to light, the exposed areas are hardened, leaving non-exposed areas removable during development. Certain negative-working printing plates contain novolac resins, a cross-linking agent, and a radiation-sensitive component that produces acid on exposure. By subsequently heating the plate, only the exposed areas are cured and the unexposed areas can be removed by a developer. The exposed, hardened areas are therefore oleophilic and will accept ink while the non-exposed underlying areas of the substrate are hydrophilic.

An alkaline developable positive-working printing plate generally has a light sensitive layer comprising a novolac resin and a radiation-sensitive component such as an o-diazoquinone or diazonaphthoquinone compound. Upon exposure to light the radiation-sensitive component is converted to the corresponding carboxylic acid. The use of an alkaline developer will remove only the exposed areas of the radiation-sensitive layer, leaving the surface of the support. Because the surface of the support is hydrophilic, the uncovered non-image area attracts water and repels the oily ink. The image area remaining after development is oleophilic thereby repelling water and attracting the printing ink.

Various aqueous solutions are known for use as developers for both positive-working and negative-working printing plates. For example, Yamasue, U.S. Pat. No. 4,259,434, describes use of a dispersion of a silicate to develop positive-working printing plates. These solutions include alkali metal silicates, in which the ratio of $SiO_2$ to M is from 0.5 to 0.75 ("M" being the alkali metal) at 1–4% $SiO_2$ concentration. However, many of such developers are overly active and attack or remove the unexposed image on the plates. Further, such developers attack the aluminum oxide layer and the aluminum on the back of the printing plate to such an extent that the developer activity decreases considerably and that sludging problems occur in the developing processor. The decrease in the developer activity due to its reaction with the carbon dioxide in air is significant as well. The replenishment rate of such developers is critical because the operational range of the developers is very narrow.

Seino, U.S. Pat. No. 4,452,880 describes silicate-containing developers in which the $SiO_2$ to alkali metal oxide ratios are much higher, that is between 1.6 and 2.0, and the % $SiO_2$ concentration is from 2 to 9%. These developers have relatively low activity, resulting in slow or incomplete development within the time suitable for practical commercial use. Thus, higher amounts of silicate must be included. Such higher amounts can be disadvantageous due to cost, residue on the plates and the potential for sludging in the processing equipment.

Miller, U.S. Pat. No. 5,851,735 discloses an aqueous alkaline developing composition that is useful in developing either positive-working or negative-working lithographic printing plates. The composition has a pH of at least 12 and comprises an alkali metal silicate and at least 6 wt % of a water-soluble or water-dispersible thickener, such as glycerol.

Toyama, GB-A-2,276,729 (DE-A-4 411 176) discloses a developer or replenisher for both positive-working and negative-working lithographic printing plates comprising an alkali metal silicate and a water-soluble ethylene oxide adduct, obtained by addition of ethylene oxide to a sugar alcohol having not less than 4 hydroxy groups. This developer is stable and shows a high developing efficiency.

Thus, a need exists for a developer system for both positive-working plates and negative-working alkaline developable plates including thermal plates, which can be used in one processor. The developer system should be able to develop both positive- and negative-working plates with a high throughput, should have a small overflow rate, should not produce any sludge, should not attack the aluminum or alumina of the printing plate base, should not attack the coating particularly in case of positive-working plates and the control of the developer activity should be carried out by means of conductivity measurements, because especially for thermal plates there are no other control elements available.

SUMMARY OF THE INVENTION

In one embodiment the invention is an aqueous alkaline developing composition that is useful in developing alkaline developable positive-working and negative-working lithographic printing plates including thermal plates. The composition comprises:

(a) at least one phosphonic acid derivative of formula I

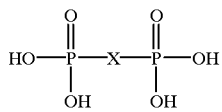

in which X is $C_2$–$C_6$ alkylene or

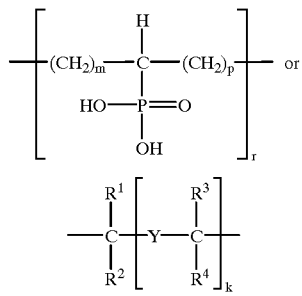

in which: k is 0 or 1; m is 1, 2, or 3; p is 1, 2, or 3; r is an integer from 10–20; $R^1$ and $R^3$ are each independently H or $C_1$–$C_4$ alkyl; $R^2$ and $R^4$ are each independently H, OH, or $C_1$–$C_4$ alkoxy; and Y is —$R^6$N—$(CH_2)_n$—$(NR^5)_q$—, in which q is 0 or 1, n is an integer from 0 to 8, and $R^5$ and $R^6$ are each independently H, $C_1$–$C_4$ alkyl, or —$CH_2$—P(O)(OH)$_2$;

(b) at least one polyglycol derivative of formula II

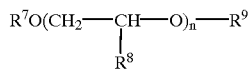

in which $R^7$ is hydrogen or $C_1$–$C_8$ alkyl; $R^8$ is hydrogen, methyl or ethyl; $R^9$ is hydrogen or $CH_2COOH$; and n is an integer from 10 to 20; and (c) at least one glycol of formula III

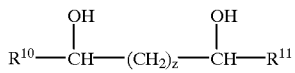

in which z is 0, 1, or 2; and $R^{10}$ and $R^{11}$ are each independently hydrogen or $C_1$–$C_3$ alkyl.

The alkaline developing composition can be used to develop imagewise exposed positive-working or negative-working lithographic printing plate as is described in more detail below. In addition the composition can also be used to develop thermal printing plates. Usually, the printing plates to be developed by the composition are based on novolac resins and/or phenolic resins.

The developer has an alkaline pH (i.e., greater than 7), typically at least about 11, preferably at least about 12, and more preferably about 12 to about 14. Beside the above essential ingredients, the developer system may comprise other conventional ingredients. These include, for example: bases, e.g. alkali metal hydroxide, which provide the necessary alkalinity; alkali metal waterglass, which prevent the attack of aluminum and alumina; and alkali phosphates and other conventional wetting agents, which disperse optional particles and makes the cleaning of the processor easier.

The developer can also be used as its own replenisher, thus eliminating the need for specially formulated replenishing solution of higher activity to maintain the activity of the processing bath. Preferably the concentration of the alkali hydroxide in the replenisher is increased to compensate the quantity of alkali hydroxide used up by the plate development so that a balance between developer drag-out and developer feed-in can be reached. There is a correlation between the value of the electric conductivity and the alkalinity of the total developer bath.

In another embodiment invention is a method of processing an imagewise exposed positive-working or negative-working lithographic printing plate with the alkaline developing composition.

In yet another embodiment the invention is a method for providing an image, the method comprising providing an alkaline developable positive-working or negative-working lithographic printing plate, imagewise exposing the printing plate to produce a latent image on the printing plate, and developing the latent image with alkaline developing composition to produce the image.

DETAILED DESCRIPTION OF THE INVENTION

Composition of the Developer

The aqueous alkaline compositions of this invention comprise besides water, at least one phosphonic acid derivative of formula I, at least one polyglycol derivative of formula II and at least one glycol of formula III. Although it is preferred that only one phosphonic acid derivative, only one polyglycol derivative and only one glycol is used, a mixture of phosphonic acid derivatives and/or of polyglycol derivatives and/or glycols can be used if desired.

In one embodiment, the composition of the invention comprises:

(a) at least one phosphonic acid derivative of formula I

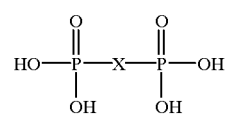

in which X is $C_2$–$C_6$ alkylene or

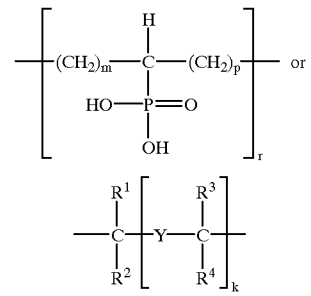

in which: k is 0 or 1; m is 1, 2, or 3; p is 1, 2, or 3; r is an integer from 10–20; $R^1$ and $R^3$ are each independently H or $C_1$–$C_4$ alkyl; $R^2$ and $R^4$ are each independently H, OH, or $C_1$–$C_4$ alkoxy; and Y is —$R^6$N—$(CH_2)_n$—$(NR^5)_q$—, in which q is 0 or 1, n is an integer from 0 to 8, and $R^5$ and $R^6$ are each independently H, $C_1$–$C_4$ alkyl, or —$CH_2$—P(O)(OH)$_2$;

(b) at least one polyglycol derivative of formula II

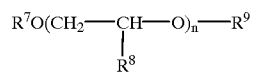

in which $R^7$ is hydrogen or $C_1$–$C_8$ alkyl; $R^8$ is hydrogen, methyl or ethyl; $R^9$ is hydrogen or $CH_2COOH$; and n is an integer from 10 to 20; and (c) at least one glycol of formula III

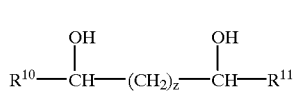

in which z is 0, 1, or 2; and $R^{10}$ and $R^{11}$ are each independently hydrogen or $C_1$–$C_3$ alkyl.

These compositions can be used either as a developer or as a replenisher. The only difference is that the electric conductivity of the replenisher has to be higher than that of the corresponding developer (i.e., the developer used with the replenisher).

Preferred compositions contain hydroxyethanediphosphonic acid or suitable salts thereof, hexamethylenediaminotetra(methylenephosphonic acid) or suitable salts thereof, aminotri(methylenephosphonic acid) or suitable salts thereof, as phosphonic acid derivative of formula I. Sodium salts thereof are especially preferred. The amount of phosphonic acid derivative is not limited, but in preferred embodiments the amount is from about 0.01 to about 5 wt %; especially preferred is from about 0.1 to about 1 wt %, based on the total weight of the composition.

In preferred embodiments the polyglycol derivatives of formula II are selected from the group consisting of derivatives of polypropylene glycol, polyethylene glycol, and polybutylene glycol, especially polypropylene glycol, polyethylene glycol, and polybutylene glycol. The amount of the polyglycol component is not limited, but in preferred embodiments it is from about 0.0005 to about 3 wt %; especially preferred is from about 0.001 to about 0.6 wt %, based on the total weight of the composition.

In preferred embodiments the glycol component of formula III is selected from the group consisting of ethylene glycol, 1,2-propanediol, 1,3-propanediol and 1,2-butanediol. The amount of the glycol component is not limited. However, preferably about 3 wt % to about 8 wt %, especially preferably not less than 4 wt %, based on the total composition weight, is used. When this concentration is used, the developer absorbs less carbon dioxide from the air than conventional developers, which contain waterglass and alkali metal hydroxide.

Especially preferred compositions contain waterglass, i.e. silicates with a molar ratio of $SiO_2$ to $M_2O$ (with M=alkali metal) of 2 or more, such as sodium waterglass and potassium waterglass. The amount thereof is not limited but it is preferred that the developer contains from about 1 to about 20 wt %, especially preferred from about 5 to about 10 wt %, waterglass.

The composition has an alkaline pH (i.e., greater than 7), typically at least about 11, preferably at least about 12, and more preferably about 12 to about 14. Alkalinity can be provided using a suitable concentration of any suitable chemical base, such as an alkali metal hydroxide (for example, sodium hydroxide, lithium hydroxide and potassium hydroxide).

Optional components include one or more surfactants (anionic, nonionic and/or amphoteric) in a suitable amount (for example up to 5 wt % based on the total composition weight), chelating agents, and biocides (antimicrobial or antifungal agent). One or more antifoaming agents, such as certain silicones, may also be included. However, in preferred embodiments, neither a surfactant, anti-foaming agent, nor a chelating agent is included in the composition.

Use of the Developer

In principle, any printing plate developable by alkaline solutions, including those not based on novolac resins, can be developed with the compositions of the invention.

In one embodiment, a positive-working printing plate is imagewise exposed using a suitable light source, making the exposed regions alkali soluble. The exposed regions are washed away with the alkaline developer to reveal the hydrophilic substrate underneath. Development of a positive-working printing plate is generally conducted at a temperature of from about 18° to about 28° C. for a period of from about 5 to about 60 seconds.

The positive-working printing plates are any of those conventionally used in the art. They typically include a metal or polymeric substrate, preferably an aluminum, aluminum alloy or treated aluminum substrate. Such substrates are well known in the art, e.g. as described in Yamasue, U.S. Pat. No. 4,259,434; Hall, U.S. Pat. No. 5,122,243; and West, U.S. Pat. No. 5,368,974. An appropriate positive-working radiation-sensitive layer that includes a photosensitive component, such as an o-diazoquinone, including an o-diazonapthoquinone compound, as described in Gath, U.S. Pat. No. 4,927,741 and GB-2,082,339, is on the substrate.

Although these radiation-sensitive compounds can be used alone, more typically they are dispersed in a suitable binder material (or mixture thereof that is soluble in the alkaline developing composition. Such binder materials include, but are not limited to, novolac-type phenolic resins, and others readily apparent to one skilled in the art. Novolac resins are commercially available and are well known to those skilled in the art. They are typically prepared by the condensation reaction of a phenol, such as phenol, m-cresol, o-cresol, p-cresol, etc, with an aldehyde, such as formaldehyde, paraformaldehyde, acetaldehyde, etc. or ketone, such as acetone, in the presence of an acid catalyst. The weight average molecular weight is typically about 1,000 to 15,000. Typical novolac resins include, for example, phenol-formaldehyde resins, cresol-formaldehyde resins, phenol-cresol-formaldehyde resins, p-t-butylphenol-formaldehyde resins, and pyrogallol-acetone resins. Particularly useful novolac resins are prepared by reacting m-cresol, mixtures of m-cresol and p-cresol, or phenol with formaldehyde using conventional conditions. Other additives that can be included in the radiation-sensitive composition, including dyes, pigments, plasticizers, and components, such as leucodyes that produce print-out images.

In another embodiment of this invention, a negative-working alkaline developable printing plate, typically one containing a novolac resin and/or a phenolic resin, is imagewise exposed with a suitable light source and heated to harden the exposed regions. The unexposed regions are washed away with the alkaline developing composition of this invention to reveal the hydrophilic substrate underneath. Especially useful are negative-working thermal plates that also contain an infrared radiation absorbing compound, rendering the radiation-sensitive layer infrared radiation (or heat) sensitive. Thus, a laser or other source of infrared radiation can be used to reduce solubility in exposed regions of the plate. Such plates belong to the so-called direct-to-plate type.

Direct-to-plate systems use digitized image information, which is typically stored on a computer disk or a computer tape. The bits of information in a digitized record correspond to the image elements or pixels of the image. This pixel record is used to control an exposure device, such as an infrared laser that produces beam of a modulated infrared radiation. The position of the exposure beam, in turn, may be controlled by a rotating drum, a leadscrew, or a turning mirror (flying spot apparatus). The exposure beam is turned on and off in correspondence with the pixels to be printed. The exposure beam is focused onto a presensitized, unexposed, lithographic printing plate. The exposed plate is submitted to any required processing steps, such as removal of unexposed material, washing, etc. to produce a lithographic printing plate ready for the printing press.

The direct-to-plate method of plate making is contrasted with the conventional method, which involves use of an exposed and processed film of the image to be printed. The image on the film is then contact printed with ultraviolet radiation onto the sensitized, unexposed printing plate (sometimes called a printing plate precursor), followed by the required plate processing procedures. The direct-to-plate method of directly imaging a lithographic plate does not require the use of any film and, thus, contributes to savings in film costs and processing. A variety of materials are known for such plates, as described, for example, in Haley, U.S. Pat. No. 5,340,699; Haley, U.S. Pat. No. 5,466,557; and DeBoer, U.S. Pat. No. 5,491,046.

On the substrate is an appropriate negative-working thermal sensitive layer that includes a thermal sensitive component, a novolac or resole resin, or both. Such materials are well known in the art, as described, for example, in Haley, U.S. Pat. No. 5,372,907. Conventional additives can be included in the radiation-sensitive composition, such as dyes, pigments, plasticizers, Bronsted acid precursors, infrared radiation absorbing compounds, sensitizers, stabilizers, surfactants, and components, such as leucodyes, that produce print-out images.

Development of a negative-working printing plate is generally conducted at a temperature of from about 18 to about 28° C. for a period of from about 5 to about 60 seconds.

The aqueous alkaline composition of this invention can be used as either a developer or a replenisher or as both a developer and a replenisher. The replenisher differs from its corresponding developer only in its conductivity. The replenisher has a conductivity higher than that of its corresponding developer (i.e., the conductivity of the developer is lower than that of the corresponding replenisher). This can, for instance, be obtained by having a higher concentration of alkali metal hydroxide in the replenisher while keeping the concentrations of the other components the same in both the developer and the replenisher.

After the developer has been used to develop a predetermined number of plates, the replenisher is added to the processor that contains the developer. Usually about 30 mL to about 100 mL (typically about 40–60 mL) of replenisher per 1 $m^2$ of exposed printing plate processed are necessary to keep the volume of developer in the processor constant. Consequently, to keep the activity of the developer constant, the difference in conductivity between the developer and the replenisher must be such that the conductivity of the developer in the processor can be kept at about at the same value by the addition of about 30 mL to about 100 mL of replenisher per 1 $m^2$ exposed printing plate processed.

Usually, the conductivity of the developer is from about 50 to about 100 mS/cm, typically from about 80 to about 95 mS/cm, at 20° C. The conductivity of the corresponding replenisher is usually from about 60 to about 150 mS/cm, typically from about 110 to about 140 mS/cm, at 20° C., but in any case higher than that of the developer to be regenerated. The invention therefore provides a composition that makes it relatively easy for the operator to keep the both the level of the developer in the processor and its activity constant.

INDUSTRIAL APPLICABILITY

The compositions are developers for both positive-working and negative-working alkaline developable lithographic printing plates, including thermal plates. In addition, the composition can also be used as replenisher for the developer.

The developer allows the simultaneous development of different kinds of plates. All common developing processors can be used in combination with a conductivity set up. Further advantages are: the high plate through-put, constant developer activity for a long period of time without performance cutback caused by carbon dioxide absorption from the air, the possibility of replenishment by either conductivity control or conventional replenishment, no attack of aluminum or alumina nor of the coating when the alkalinity is high, shorter exposure time with conventional positive-plates, no deposits of $SiO_2$, calcium and magnesium salts, no sludging, and easy cleaning of the processor. Because of the high developing capacity of the developer, only a small amount of waste solution is produced.

The advantageous properties of the invention may be observed by reference to the following examples, which illustrate, but do not limit the invention.

EXAMPLES

Glossary

AKYPO® LF6 Polyethyleneglycol ether derivative (Chemy)
DEQUEST® 2006 Pentasodium salt of aminotri(methylenephosphonic acid) (Brenntag)
Pluriol P600 Polypropyleneglycol ether (BASF)
REWOTERIC® AM-V Wetting agent (Witco)
Sequion 10 Na Sodium salt of hydroxyethane diphosphonic acid) Polygon
Sequion 50 K 33 Potassium salt of hexamethylenediaminotetra(methylenephosphonic acid) (Polygon)
Sulfetal 4105 Wetting agent (Zimmer & Schwarz)

EXAMPLE 1

Preparation of Developer 1

A developer is prepared from the following components under stirring:

71.9 kg water 13.4 kg potassium hydroxide solution 45 wt % in water 2.6 kg phosphoric acid 85% in water 7.3 kg potassium waterglass 42/43 degrees Be in water 0.23 kg REWOTERIC® AM-V 0.23 kg Sequion 10 Na 0.0023 kg Pluriol P600

4.37 kg ethylene glycol and the mixture is subsequently filtrated. It is stored in a closed container prior to its use. This developer has a conductivity of 91 mS/cm at 20° C.

EXAMPLE 2
Preparation of Replenisher 1

A replenisher is prepared from the following components under stirring:

69.4 kg water 16.1 kg potassium hydroxide solution 45 wt % in water 2.6 kg phosphoric acid 85% in water 7.3 kg potassium waterglass 42/43 degrees Be in water 0.23 kg REWOTERIC® AM-V 0.23 kg Sequion 10 Na 0.0023 kg Pluriol P600

4.37 kg ethylene glycol and the mixture is subsequently filtrated. It is stored in a closed container prior to its use. This replenisher has a conductivity of 119 mS/cm at 20° C.

EXAMPLE 3
Preparation of Developer 2

A developer is prepared from the following components under stirring:

75.8 kg water 13.4 kg potassium hydroxide solution 45 wt % in water 2.6 kg phosphoric acid 85% in water 7.3 kg potassium waterglass 42/43 degrees Be in water 0.23 kg REWOTERIC® AM-V 0.26 kg Sequion 50 K 33

0.0023 kg Pluriol P600

4.37 kg ethylene glycol and the mixture is subsequently filtrated. It is stored in a closed container prior to its use. This developer has a conductivity of 90 mS/cm at 20° C.

EXAMPLE 4
Preparation of Replenisher 2

A replenisher is prepared from the following components under stirring:

72.8 kg water 16.1 kg potassium hydroxide solution 45 wt % in water 2.6 kg phosphoric acid 85% in water 7.3 kg potassium waterglass 42/43 degrees Be in water 0.23 kg REWOTERIC® AM-V 0.26 kg Sequion 50 K 33

0.0023 kg Pluriol P600

4.37 kg ethylene glycol and the mixture is subsequently filtrated. It is stored in a closed container prior to its use. This replenisher has a conductivity of 111 mS/cm at 20° C.

EXAMPLE 5
Preparation of Developer 3

A developer is prepared from the following components under stirring:

75.8 kg water 6.6 kg potassium hydroxide (solid, purity 90%)

2.6 kg phosphoric acid 85% in water 7.3 kg potassium waterglass 42/43 degrees Be in water 0.23 kg REWOTERIC® AM-V 0.25 kg DEQUEST® 2006

0.003 kg AKYPO® LF6

4.37 kg ethylene glycol and the mixture is subsequently filtrated. It is stored in a closed container prior to its use. This developer has a conductivity of 87 mS/cm at 20° C.

EXAMPLE 6
Preparation of Developer 4

A developer is prepared from the following components under stirring:

75.1 kg water 13.4 kg potassium hydroxide solution 45 wt % in water 2.6 kg phosphoric acid 85% in water 7.3 kg potassium waterglass 42/43 degrees Be in water 0.45 kg Sulfetal 4105

0.25 kg DEQUEST® 2006

0.003 kg AKYPO® LF6

5.1 kg 1,2-propanediol and the mixture is subsequently filtrated. It is stored in a closed container prior to its use. This developer has a conductivity of 86 mS/cm at 20° C.

EXAMPLE 7
Preparation of Developer 5

A developer is prepared from the following components under stirring:

75.1 kg water 4.7 kg sodium hydroxide (solid, 90% purity)

2.6 kg phosphoric acid 85% in water 7.3 kg potassium waterglass 42/43 degrees Be in water 0.45 kg Sulfetal 4105

0.25 kg DEQUEST® 2006

0.003 kg AKYPO® LF6

5.1 kg 1,2-propanediol and the mixture is subsequently filtrated. It is stored in a closed container prior to its use. This developer has a conductivity of 55 mS/cm at 20° C.

Comparative Example 1

A developer is prepared from the following components under stirring:

76.5 kg water 13.4 kg potassium hydroxide solution 45 wt % in water 2.6 kg phosphoric acid 85% in water 7.3 kg potassium waterglass 42/43 degrees Be in water 0.23 kg REWOTERIC® AM-V and the mixture is subsequently filtrated. It is stored in a closed container prior to its use.

Comparative Example 2

A developer is prepared from the following components under stirring:

76.3 kg water 13.4 kg potassium hydroxide solution 45 wt % in water 2.6 kg phosphoric acid 85% in water 7.3 kg potassium waterglass 42/43 degrees Be in water 0.23 kg REWOTERIC® AM-V 0.23 kg Sequion 10 Na and the mixture is subsequently filtrated. It is stored in a closed container prior to its use.

Comparative Example 3

A developer is prepared from the following components under stirring:

76.3 kg water 13.4 kg potassium hydroxide solution 45 wt % in water 2.6 kg phosphoric acid 85% in water 7.3 kg potassium waterglass 42/43 degrees Be in water 0.23 kg REWOTERIC® AM-V 0.23 kg Sequion 10 Na 0.0023 kg Pluriol P600 and the mixture is subsequently filtrated. It is stored in a closed container prior to its use.

Comparative Example 4 (according to U.S. Pat. No. 5,851,735)

74.1 kg water 9.8 kg potassium silicate dispersion (Kasil 2130, 30% in water)

4.0 kg potassium hydroxide (solid, 90% purity)

12.0 kg glycerine

Exposure and Developing of the Positive-working Printing Plates

The positive-working printing plates Easyprint™ and Virage™ used in the following examples are available from Kodak Polychrome Graphics LLC. They were cut to a size of 790×850 mm and exposed with a metal halide lamp (MH-Burner, available from Sack) with 510 mJ/cm$^2$ (Easyprint™) and 525 mJ/cm$^2$ (Virage™) under a silver halide film half-step wedge (test strips from Fogra) with a density range of 0.15 to 1.95 in 0.15 increments as a positive copy.

A commercially available processor (Mercury 850; Polychrome Graphics LLC), equipped with an immersion type developing bath, a section for rinsing with water, a gumming and a drying section, was used to develop the exposed plates. The processor was filled with 60 L of the appropriate developer. If the processor contains more than the given volume of 60 L, the excess is removed via an overflow. This excess can be collected in a container. Separately, a container for the replenisher was attached from which a predetermined amount of replenisher per square meter of exposed plate was added to the developing bath via a pump.

The activity of the developer was examined with the help of its conductivity and by titration of the amount of alkali. The conductivity of the developing bath was monitored by an incorporated conductivity measuring unit of the type Conductivity Monitor (Unigraph). To determine the alkali content, 10 mL of the developer was removed from the developing bath, 90 mL deionized water was added, and titration was carried out with 0.5 N HCl (Titrino DMS 716, Metrohm). The number of mL used to reach the first equivalence point is referred to as alkali value.

The following other parameters were kept constant in all tests:

temperature of the developing bath (23±1)° C.

dwell time in the developer 25 sec

To evaluate the copies obtained after development, the following criteria were examined: steps of the gray wedge that are not covered at all (in the following referred to as GW), microlines that have not yet been attacked (in the following referred to as ML), behavior during the print proof or during restarting of the printing (ink acceptance problems of the image and non-image areas).

To obtain the latter test results, the exposed and developed plates were mounted in a sheet-fed offset press and proofed. The image areas accepted ink without any problems and the paper copies did not show any background (referred to as toning) in the non-image areas. After about 1000 copies, the press was stopped for about 30 minutes and then restarted (restarting test). The same results as at the beginning of the printing test were obtained. In particular the non-image areas did not show any toning, which indicates a good protection of the basis material by the developer.

Copying Results with the Developers of the Invention

The copying results obtained with Easyprint™ and Virage™ plates and the developers of the invention are listed in Table 1 below. As can be seen, the different developers yield nearly identical results in both examined plates as regards gray wedge and microline resolution. The slight differences obtained with developer 1 are due to its slightly elevated alkali value (11.0 mL) compared to those of the other developers (10.4 to 10.6 mL).

TABLE 1

| Parameter | Example 1 | Example 3 | Example 5 | Example 6 | Example 7 |
|---|---|---|---|---|---|
| Easyprint ™ | | | | | |
| GW | 3/4 | 3 | 3 | 3 | 3 |
| ML | 12/15 | 10/12 | 10/12 | 10/12 | 10/12 |
| Print | no toning | no toning | no toning | no toning | no toning |
| Virage ™ | | | | | |
| GW | 3/4 | 3 | 3 | 3 | 3 |
| ML | 12/15 | 10/12 | 10/12 | 10/12 | 10/12 |
| Print | no toning | no toning | no toning | no toning | no toning |

Exposure, Developing and Copying Results of the Negative-working Plate

The negative-working printing plate is a digital thermographic printing plate DITP (Kodak Polychrome Graphics LLC). The plates have been cut to a size of 790×850 mm and exposed in the IR-exposure unit Trendsetter 3244 (from Creo/Heidelberg), using an energy of 7.5 W and a rotational speed of the drum of 165 rpm. The Kodak Professional Colorflow Strip (available from Eastman Kodak), which contains different elements for evaluating the quality of the copies, was used for imaging. Then the plates were treated at a temperature of 140° C. in a continuous oven (available from Techno Graphica) with a flow rate of 85 cm/min.

A commercially available processor (Mercury 850; Kodak Polychrome Graphics LLC), equipped with an immersion type developing bath, a section for rinsing with water, and a gumming and a drying section, was used to develop the imagewise exposed plates after they had been cooled to room temperature. The processor was filled with 60 L of the appropriate developer. Separately, a container for the replenisher was attached from which a predetermined amount of replenisher per square meter of exposed plate was added to the developing bath via a pump.

The following other parameters were kept constant in all tests:

temperature of the developing bath (23±1)° C.

dwell time in the developer 25 sec

The activity of the developer was examined with the help of its conductivity and by titration of the amount of alkali. The conductivity of the developing bath and the content of alkali were monitored as described above.

To evaluate the copies obtained after pre-heating and developing, the following criteria were examined: quality of the reproduction of the 1 and 2 pixel elements, optical density of the checkerboard dots of the pixel elements, behavior during print proof or during restarting of the printing.

The results show that all the inventive developers of Examples 1, 3, 4, 5 and 6 result in a good reproduction of the 1 pixel elements and that the density of the 50% checkerboard dots of all pixel elements is 50% (measured with the apparatus D19C/D196 from Gretag/Macbeth). No differences in quality of the various developers were observed.

The plates were mounted in a sheet-fed offset press and proofed. The image areas accepted ink without any problems and the paper copies did not show any toning in the non-image areas. After about 1000 copies, the press was stopped for about 30 minutes and then restarted. The same results as at the beginning of the printing test were obtained. In particular, the non-image areas did not show any toning, which indicates a good protection of the basis material by the developer.

Stability and Load Tests of Easyprint™ Plates

Easyprint™ plates exposed with the UGRA wedge in the same manner as described above were developed one after another at a rate of 300 plates per day for 25 days (plus 4 weekend interruptions) in the Mercury 850 processor. The quality of the resulting copies was evaluated in terms of the GW and the ML values. The activity of the developer was monitored at a throughput of 4 $m^2$/L by the conductivity and the titration of 0.5 N HCl.

The results for developer 1 and the corresponding replenisher 1 are listed in Table 2. The titration and conductivity data show that the activity of the developer can be kept constant during long testing period by the addition of replenisher in the amount of 50 mL/1 $m^2$ of developed plate. This also becomes apparent in the almost constant values for the copy parameters gray wedge and microlines after the development of 6000 $m^2$ plates in the 60 L developer of the processor. Throughout the course of the test, 120 L of overflow of used developer was collected which corresponds to a value of 20 mL/$m^2$ of developed plate.

During the test period, the developing process was not affected by either the formation of foam or the precipitation of insoluble material on the bottom of the processor. After the testing was completed, the processor could be easily cleaned by rinsing with water, and no residue remained.

After a throughput of 40, 60, 80 and 100 $m^2$/L, Easyprint™ plates did not show any irregularities in the printing test. Neither ink acceptance nor toning problems occurred. These results show that an even higher throughput is possible with the same amount of replenisher.

The procedure was repeated with Easyprint™ plates and developer 2 and replenisher 2. It was found that by adding 53 mL of replenisher 2, the activity of the developer could be kept constant until the end of the testing at 100 $m^2$/L (conductivity: 90 mS/cm; titration: 10.8 mL). Also, the copy parameters of GW=3 and ML=10/12 in the beginning only slightly changed to GW=3/4 and ML=12 after a plate throughput of 100 $m^2$/L. Plates developed with such a developer showed no problems in ink acceptance or toning during the printing test at the print proof and upon restarting. These results show that an even higher throughput is possible with the same amount of replenisher.

TABLE 2

| Throughput ($m^2$/L) | Microlines | Gray scale | Replenisher (mL/$m^2$) | Titration (mL 0.5 n HCl) | Conductivity (mS/cm) |
| --- | --- | --- | --- | --- | --- |
| 0 | 12/15 | 3/4 | 50 | 11.0 | 91.0 |
| 4 | 15 | 3/4 | 50 | 11.2 | 91.4 |
| 8 | 15 | 3/4 | 50 | 11.7 | 91.8 |
| 12 | 15 | 3/4 | 50 | 11.4 | 91.6 |
| 16 | 12/15 | 3/4 | 50 | 11.1 | 91.5 |
| 20 | 15 | 3/4 | 50 | 11.2 | 91.5 |
| 24 | 12/15 | 3/4 | 50 | 11.3 | 91.7 |
| 28 | 15 | 4 | 50 | 11.5 | 91.7 |
| 32 | 12/15 | 3/4 | 50 | 11.8 | 91 |
| 36 | 15 | 4 | 50 | 11.8 | 91.1 |
| 40 | 15 | 4 | 50 | 11.1 | 90.9 |
| 44 | 15 | 4 | 50 | 11.4 | 91.0 |
| 48 | 15 | 4 | 50 | 11.9 | 91.5 |
| 52 | 15 | 4 | 50 | 12.1 | 91.6 |
| 56 | 15 | 4 | 50 | 11.9 | 90.8 |
| 60 | 15 | 3/4 | 50 | 11.1 | 90.5 |
| 64 | 15 | 4 | 50 | 11.7 | 90.7 |
| 68 | 15 | 3/4 | 50 | 11.0 | 90.5 |
| 72 | 15 | 4 | 50 | 10.8 | 90.2 |
| 76 | 12/15 | 3/4 | 50 | 10.5 | 91.5 |
| 80 | 15 | 3/4 | 50 | 10.8 | 91.6 |
| 84 | 15 | 4 | 50 | 11.1 | 91.4 |
| 88 | 15 | 4 | 50 | 11.9 | 92.0 |
| 92 | 15 | 4 | 50 | 11.8 | 91.8 |
| 96 | 15 | 4 | 50 | 11.8 | 92.0 |
| 100 | 15 | 4 | 50 | 11.9 | 92.3 |

Stability and Load Tests of DITP Plates

DITP plates, which had been imaged with the Eastman Kodak wedge and heated in the same manner as described above, were developed one after another at a rate of 200 plates per day for 25 days (plus 4 weekend interruptions) in the Mercury 850 processor. The quality of the resulting copies was evaluated in terms of the optical density of the 50% checkerboard of the 2 pixel element. The activity of the developer was monitored at a throughput of 4 $m^2$/L by the conductivity and the titration of 0.5 N HCl.

The results for developer 1 and the corresponding replenisher 1 are listed in Table 3 below. The titration and conductivity data show that the activity of the developer can be kept constant during the long testing period by the addition of replenisher in the amount of 60 mL/$m^2$ of the developed plate. This also becomes apparent in the almost constant values for the copy parameters after the development of 3120 $m^2$ plates in the 60 L developer of the processor. Throughout the course of the test, 94 L of overflow of used developer was collected, which corresponds to about 30 mL/$m^2$ of processed printing plate.

During the test period, the developing process of the DITP plates was not affected by the formation of foam or by the precipitation of insoluble material on the bottom of the processor. After the testing was completed, the processor could be easily cleaned by rinsing with water, and no residue remained.

After a throughput of 20, 40 and 52 $m^2$/L, DITP plates did not show any irregularities in the printing test. Neither ink acceptance nor toning problems occurred.

TABLE 3

| Throughput ($m^2$/L) | Optical density* (%) | Replenisher (mL/$m^2$) | Conductivity (mS/cm) | Titration (mL 0.5 n HCl) |
| --- | --- | --- | --- | --- |
| 0 | 50 | 60 | 90.0 | 11.2 |
| 4 | 49 | 60 | 90.5 | 11.2 |
| 8 | 50 | 60 | 90.9 | 11.0 |

TABLE 3-continued

| Throughput (m²/L) | Optical density* (%) | Replenisher (mL/m²) | Conductivity (mS/cm) | Titration (mL 0.5 n HCl) |
|---|---|---|---|---|
| 12 | 50 | 60 | 91.2 | 11.0 |
| 16 | 49 | 60 | 90.2 | 10.8 |
| 20 | 50 | 60 | 90.4 | 10.8 |
| 24 | 51 | 60 | 90.3 | 10.8 |
| 28 | 50 | 60 | 89.9 | 11.2 |
| 32 | 49 | 60 | 90.9 | 11.0 |
| 36 | 50 | 60 | 91.4 | 11.0 |
| 40 | 50 | 60 | 90.5 | 11.0 |
| 44 | 51 | 60 | 90.0 | 11.0 |
| 48 | 50 | 60 | 89.9 | 11.0 |
| 52 | 51 | 60 | 90.5 | 11.2 |

*Optical density of the 50% checkerboard dots of the 2 pixel element

Developing with a Plate Mix

To determine whether the coating components of Easyprint™ and DITP plates contained in used developer affect the development of the other plate, the following cross tests were carried out:

In a developer comprising developer 1 and replenisher 1 in which 20 m²/L Easyprint™ plates had been developed (cf. Table 2), 20 m² exposed and after-heated DITP plates were subsequently developed. Both the copy values and the printing properties of the thus developed DITP plates corresponded to standard values. Furthermore, no precipitation was observed in the developing processor.

In a developer comprising developer 1 and replenisher 1 in which 16 m²/L DITP plates had been developed (cf. Table 3), 20 m² exposed Easyprint™ plates were subsequently developed. Both the copy values and the printing properties of the thus developed Easyprint plates corresponded to standard values. Furthermore, no precipitation was observed in the developing processor.

Developing Easyprint™ Plates with the Developing Compositions of the Comparative Examples Easyprint™ plates were developed in the same manner as described above in the developing processor with the developers listed in Comparative Examples 1 to 4. Furthermore, plates were developed manually after a soak time of 5 minutes. In both cases the copy parameters and the attack on aluminum oxide (front side of the plate) and aluminum (back side of the plate) were monitored. The results are listed in Table 4.

It was found that although the copy results after a short soak time of 25 sec are identical for almost all the tested developers, there are clear differences after a soak time of 5 minutes. These differences are due to the Al/Al₂O₃ attack by the conventional developers and indicate the improvement achieved by the developers of the invention.

A stability and load test of Comparative Example 4, carried out in the same manner as that of the developers 1 and 2 according to the invention, provided the following results:

(1) At a plate throughput of up to 4 m²/L, 180 mL of replenisher is necessary per m² in order to keep the activity of the developing bath somewhat constant.
(2) Additionally, at a higher plate throughput, the soak time has to be continuously increased so that the standard copy parameters can be achieved.
(3) At a plate throughput of about 15 m²/L, a precipitate was formed in the processor.
(4) At a plate throughput of about 20 m²/L, the developer in the processor has to be exchanged because the standard copy parameters are no longer obtained and formation of precipitate is so strong that the plates are soiled.

A comparison with the results of Table 2 shows a clear improvement of the plate throughput and a decrease in the overflow amount (150 mL/m² in the comparative solution compared to 20 mL/m² in developer 1).

TABLE 4

| | Conductivity (mS/cm) | 25 s soak time | | 5 min soak time | | Al/Al₂O₃ Attack |
|---|---|---|---|---|---|---|
| | | GW | ML | GW | ML | |
| Example 1 | 90.6 | 4 | 12/15 | 7 | 15/20 | no Attack |
| Comp. Example 1 | 103.0 | 4 | 15 | >13 | >70 | strong attack |
| Comp. Example 2 | 101.6 | 4 | 12/15 | >13 | >70 | little attack |
| Comp. Example 3 | 101.6 | 4 | 12/15 | 7 | 15/20 | little attack |
| Comp. Example 4 | 80.5 | 4 | 12/15 | >13 | >70 | very little attack |

The invention has been described in detail, with particular reference to certain preferred embodiments thereof, but it should be understood that variations and modifications can be effected within the spirit and scope of the invention.

Having described the invention, we now claim the following and their equivalents.

What is claimed is:

1. A composition useful as a developer for alkaline developable printing plates, the composition being an aqueous alkaline composition comprising:

(a) at least one phosphonic acid derivative of formula I

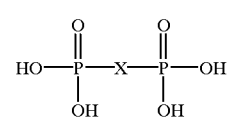

in which X is C₂–C₆ alkylene or

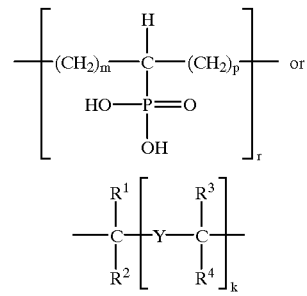

in which: k is 0 or 1; m is 1, 2, or 3; p is 1, 2, or 3; r is an integer from 10–20; $R^1$ and $R^3$ are each independently H or $C_1$–$C_4$ alkyl; $R^2$ and $R^4$ are each independently H, OH, or $C_1$–$C_4$ alkoxy; and Y is —R⁶N—$(CH_2)_n$—$(NR^5)_q$—, in which q is 0 or 1, n is an integer from 0 to 8, and $R^5$ and $R^6$ are each independently H, $C_1$–$C_4$ alkyl, or —$CH_2$—P(O)(OH)₂;

(b) at least one polyglycol derivative of formula II

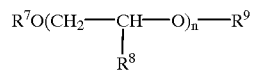

in which $R^7$ is hydrogen or $C_1$–$C_8$ alkyl; $R^8$ is hydrogen, methyl or ethyl; $R^9$ is hydrogen or $CH_2COOH$; and n is an integer from 10 to 20; and (c) at least one glycol of formula III

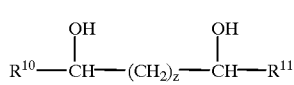

in which z is 0, 1, or 2; and $R^{10}$ and $R^{11}$ are each independently hydrogen or $C_1$–$C_3$ alkyl.

2. The composition of claim 1 in which the pH of the composition is at least about 12.

3. The composition of claim 1 in which the amount of the phosphonic acid derivative in the composition is from about 0.01 wt % to about 5 wt % based on the total weight of the composition.

4. The composition of claim 1 in which the amount of the polyglycol derivative in the composition is from about 0.0005 wt % to about 3 wt % based on the total weight of the composition.

5. The composition of claim 1 in which the amount of the glycol in the composition is from about 3 wt % to about 8 wt % based on the total weight of the composition.

6. The composition of claim 1 in which the phosphonic acid derivative is selected from the group consisting of hydroxyethanediphosphonic acid, aminotri(methylenephosphonic acid), hexamethylenediaminotetra(methylenephosphonic acid), sodium salts thereof, and mixtures thereof.

7. The composition of claim 1 in which the polyglycol derivative is selected from the group consisting of polypropylene glycol ether, polyethylene glycol ether, polybutylene glycol ether, derivatives thereof, and mixtures thereof.

8. The composition of claim 1 in which the glycol is selected from the group consisting of ethylene glycol, 1,2-propanediol, 1,3-propanediol, 1,2-butanediol, and mixtures thereof.

9. The composition of claim 1 further comprising at least one additive selected from the group consisting of surfactants, biocide, antifoaming agents and chelating agents.

10. The composition of claim 1 additionally comprising an alkali metal waterglass.

11. The composition of claim 1 in which the pH of the composition is at least about 12; the amount of the phosphonic acid derivative in the composition is from about 0.01 wt % to about 5 wt % based on the total weight of the composition; the amount of the polyglycol derivative in the composition is from about 0.0005 wt % to about 3 wt % based on the total weight of the composition; and the amount of the glycol in the composition is from about 3 wt % to about 8 wt % based on the total weight of the composition.

12. The composition of claim 11 in which the phosphonic acid derivative is selected from the group consisting of hydroxyethanediphosphonic acid, aminotri(methylenephosphonic acid), hexamethylenediaminotetra(methylenephosphonic acid), sodium salts thereof, and mixtures thereof; the polyglycol derivative is selected from the group consisting of polypropylene glycol ether, polyethylene glycol ether, polybutylene glycol ether, derivatives thereof, and mixtures thereof; and the glycol is selected from the group consisting of ethylene glycol, 1,2-propanediol, 1,3-propanediol, 1,2-butanediol, and mixtures thereof.

13. The composition of claim 12 in which the pH of the composition is from about 12 to about 14 and the composition additionally comprises an alkali metal hydroxide.

14. A method for processing, comprising:
(a) developing an imagewise exposed lithographic printing plate with an aqueous alkaline developer comprising:
(i) at least one phosphonic acid derivative of formula I

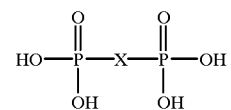

in which X is $C_2$–$C_6$ alkylene or

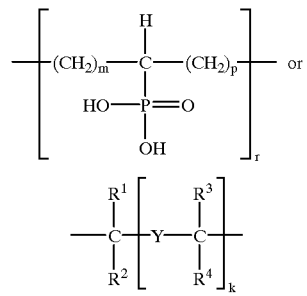

in which: k is 0 or 1; m is 1, 2, or 3; p is 1, 2, or 3; r is an integer from 10–20; $R^1$ and $R^3$ are each independently H or $C_1$–$C_4$ alkyl; $R^2$ and $R^4$ are each independently H, OH, or $C_1$–$C_4$ alkoxy; and Y is $-R^6N-(CH_2)_n-(NR^5)_q-$, in which q is 0 or 1, n is an integer from 0 to 8, and $R^5$ and $R^6$ are each independently H, $C_1$–$C_4$ alkyl, or $-CH_2-P(O)(OH)_2$;

(ii) at least one polyglycol derivative of formula II

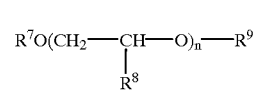

in which $R^7$ is hydrogen or $C_1$–$C_8$ alkyl; $R^8$ is hydrogen, methyl or ethyl; $R^9$ is hydrogen or $CH_2COOH$; and n is an integer from 10 to 20; and (iii) at least one glycol of formula III

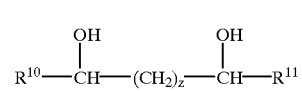

in which z is 0, 1, or 2; and $R^{10}$ and $R^{11}$ are each independently hydrogen or $C_1$–$C_3$ alkyl; and in which the developer has an original conductivity, the original conductivity being the conductivity of the developer before step (a).

15. The method of claim 14 in which the pH of the developer is at least about 12; the amount of the phosphonic acid derivative in the developer is from about 0.01 wt % to about 5 wt % based on the total weight of the developer; the amount of the polyglycol derivative in the developer is from about 0.0005 wt % to about 3 wt % based on the total weight of the developer; and the amount of the glycol in the developer is from about 3 wt % to about 8 wt % based on the total weight of the developer.

16. The method of claim 15 in which the phosphonic acid derivative is selected from the group consisting of hydroxyethanediphosphonic acid, aminotri-(methylenephosphonic acid), hexamethylenediaminotetra(methylenephosphonic acid), sodium salts thereof, and mixtures thereof; the polyglycol derivative is selected from the group consisting of polypropylene glycol ether, polyethylene glycol ether, polybutylene glycol ether, derivatives thereof, and mixtures thereof; and the glycol is selected from the group consisting of ethylene glycol, 1,2-propanediol, 1,3-propanediol, 1,2-butanediol, and mixtures thereof.

17. The method of claim 16 in which the pH of the developer is from about 12 to about 14 and the developer additionally comprises an alkali metal hydroxide.

18. The method of claim 17 in which the developer additionally comprises an alkali metal waterglass.

19. The method of claim 18 in which the printing plate comprises a support having thereon a radiation-sensitive, negative-working composition.

20. The method of claim 19 in which the negative-working, radiation-sensitive composition comprises a novolac resin and an infrared radiation absorbing compound.

21. The method of claim 18 in which the printing plate comprises a support having thereon a radiation-sensitive, positive-working composition.

22. The method of claim 21 in which the positive-working, radiation-sensitive composition comprises a novolac resin and an infrared radiation absorbing compound.

23. The method of claim 14 additionally comprising, after step (a), the step of:
(b) adding a replenisher to the developer to form a replenished developer:
in which
the replenisher has a conductivity and comprises:
(i) at least one phosphonic acid derivative of formula I

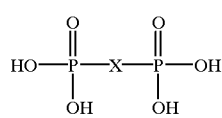

in which X is $C_2$–$C_6$ alkylene or

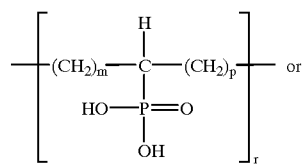

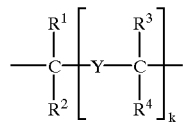

in which: k is 0 or 1; m is 1, 2, or 3; p is 1, 2, or 3; r is an integer from 10–20; $R^1$ and $R^3$ are each independently H or $C_1$–$C_4$ alkyl; $R^2$ and $R^4$ are each independently H, OH, or $C_1$–$C_4$ alkoxy; and Y is —$R^6$N—$(CH_2)_n$—$(NR^5)_q$—, in which q is 0 or 1, n is an integer from 0 to 8, and $R^5$ and $R^6$ are each independently H, $C_1$–$C_4$ alkyl, or —$CH_2$—$P(O)(OH)_2$;

(ii) at least one polyglycol derivative of formula II

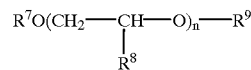

in which $R^7$ is hydrogen or $C_1$–$C_8$ alkyl; $R^8$ is hydrogen, methyl or ethyl; $R^9$ is hydrogen or $CH_2COOH$; and n is an integer from 10 to 20; and (iii) at least one glycol of formula III

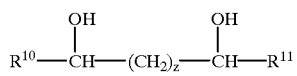

in which z is 0, 1, or 2; and $R^{10}$ and $R^{11}$ are each independently hydrogen or $C_1$–$C_3$ alkyl;
about 30 mL to 100 mL of the replenisher is added to the developer per 1 $m^2$ of imagewise exposed lithographic printing plate processed;
the original conductivity of the developer is lower than the conductivity of the replenisher; and
the conductivity of the replenished developer is about the original conductivity of the developer.

24. The method of claim 23 in which the conductivity of the developer is from about 50 to about 100 mS/cm at 20° C. and the conductivity of the replenisher is from about 60 to about 150 mS/cm at 20° C.

25. The method of claim 24 in which the pH of the developer is at least about 12; the amount of the phosphonic acid derivative in the developer is from about 0.01 wt % to about 5 wt % based on the total weight of the developer; the amount of the polyglycol derivative in the developer is from about 0.0005 wt % to about 3 wt % based on the total weight of the developer; and the amount of the glycol in the developer is from about 3 wt % to about 8 wt % based on the total weight of the developer.

26. The method of claim 25 in which the phosphonic acid derivative is selected from the group consisting of hydroxyethanediphosphonic acid, aminotri-(methylenephosphonic acid), hexamethylenediaminotetra(methylenephosphonic acid), sodium salts thereof, and mixtures thereof; the polyglycol derivative is selected from the group consisting of polypropylene glycol ether, polyethylene glycol ether, polybutylene glycol ether, derivatives thereof, and mixtures thereof; and the glycol is selected from the group consisting of ethylene glycol, 1,2-propanediol, 1,3-propanediol, 1,2-butanediol, and mixtures thereof.

27. The method of claim 26 in which the pH of the developer is from about 12 to about 14 and the developer additionally comprises an alkali metal waterglass.

28. The method of claim 27 in which the conductivity of the developer is from about 80 to about 95 mS/cm at 20° C. and the conductivity of the replenisher is from about 110 to about 140 mS/cm at 20° C.

29. The method of claim 28 in which the printing plate comprises a support having thereon a radiation-sensitive, negative-working composition.

30. The method of claim 29 in which the negative-working, radiation-sensitive composition comprises a novolac resin and an infrared radiation absorbing compound.

31. The method of claim 28 in which the printing plate comprises a support having thereon a radiation-sensitive, positive-working composition.

32. The method of claim 31 in which the positive-working, radiation-sensitive composition comprises a novolac resin and an infrared radiation absorbing compound.

33. The method of claim 14 in which the imagewise exposed lithographic printing plate is formed by exposing an unexposed lithographic printing plate with modulated infrared radiation.

34. The method of claim 33 in which the printing plate comprises radiation-sensitive composition on a substrate, the radiation-sensitive composition comprising a novolac resin and an infrared radiation absorbing compound.

* * * * *